United States Patent [19]
Kikinis

[11] Patent Number: 5,822,266
[45] Date of Patent: Oct. 13, 1998

[54] APPARATUS AND METHOD FOR MINIMIZING DRAM RECHARGE TIME

[75] Inventor: Dan Kikinis, Saratoga, Calif.

[73] Assignee: Elonex PLC, London, United Kingdom

[21] Appl. No.: 908,363

[22] Filed: Aug. 7, 1997

Related U.S. Application Data

[62] Division of Ser. No. 651,897, May 21, 1996, Pat. No. 5,663,916.

[51] Int. Cl.$^6$ ........................................... G11C 7/00
[52] U.S. Cl. .................... 365/222; 365/149; 365/189.04; 365/189.12; 365/203
[58] Field of Search ..................... 365/222, 203, 365/189.12, 149, 189.04

[56] References Cited

U.S. PATENT DOCUMENTS

| | | | |
|---|---|---|---|
| 5,359,566 | 10/1994 | Furuyama | 365/149 |
| 5,410,505 | 4/1995 | Furuyama | 365/189.05 |
| 5,467,303 | 11/1995 | Hasegawa et al. | 365/149 |
| 5,530,670 | 6/1996 | Matsumoto | 365/189.01 |

Primary Examiner—David C. Nelms
Assistant Examiner—Hien Nguyen
Attorney, Agent, or Firm—Donald R. Boys

[57] ABSTRACT

A Dynamic random access memory has multiple registers dedicated to each column, and is controlled to refresh by reading multiple bit values from distinct capacitance storage cells consecutively, followed by consecutive refresh steps for the same capacitance storage cells equal in number to the number of consecutive read steps. As each bit value is read, it is stored in a distinct bit register reserved for that cell. The interleaved refresh provided minimizes DRAM access time, and provides a memory architecture wherein distinct, separate register arrays may be dedicated to and support distinctly different functions, such as servicing a CPU and a video system.

4 Claims, 2 Drawing Sheets

5,822,266

APPARATUS AND METHOD FOR MINIMIZING DRAM RECHARGE TIME

This is a Divisional application of the U.S. application Ser. No. 08/651,897, filed on Apr. 21, 1996, now U.S. Pat. No. 5,663,916.

FIELD OF THE INVENTION

The present invention is in the area of memory architecture and is particularly relevant to methods to reduce the time required for a dynamic random-access memory (DRAM) to store and retrieve data.

BACKGROUND OF THE INVENTION

A single memory cell of a dynamic random-access memory comprises an access transistor and a capacitor that retains an electrical charge representing a data bit. Partly because the access transistor of such a cell is not a perfect insulator, an electric charge residing in the capacitor leaks out over the course of time. Because of this leakage, barring any change of state required in the bit-state, the charge representing a bit must be replenished periodically.

A single instance of recharging the capacitors for a row of DRAM cells is called in the art a refresh cycle. A refresh cycle is basically a read cycle without data transfer to the memory I/O port.

Various schemes are employed in current art to compensate for the time required for a refresh cycle, but there are no refresh protocols that do not depend at least to some extent on time that might be otherwise profitably used by a computer.

A refresh cycle starts with a read operation during which electric charges stored in memory cells of an addressed row are sensed and amplified. The amplified charges are then returned to the memory cells to replenish (refresh) the charges in the memory cells. Every page read or refresh action is immediately followed by a precharge operation during which the electric potential of all bit lines is returned to about one-half the memory supply voltage. Whatever is done to limit the time required for a refresh, the recharge time is non-productive and contributes to the length of the overall refresh cycle. Consequently, precharge time retards the rate at which data may be stored and retrieved from DRAM.

Steady advances have been achieved in computer performance by many inventive methods and apparatus. Still, developers are aware that like improvements must be made in CPUs as in memory performance to achieve even better performance. Unfortunately, memory speed, and in particular DRAM speed, has not increased at the same rate as microprocessor speed.

What is clearly needed is a method to improve DRAM speed by reducing the time needed for precharge operations.

SUMMARY OF THE INVENTION

In a preferred embodiment of the present invention, a dynamic random access memory (DRAM) array is provided comprising plural bit columns, wherein each bit column comprises a precharge circuit; a bit line connected to the precharge circuit; a plurality of capacitance elements for storing charges representing bits, the capacitance elements connected through access transistors to the bit line; an amplifier connected to the bit line; and at least two bit registers connected to the amplifier. In this memory array at least two read steps are performed consecutively in refresh cycles, reading the bit value in separate capacitance elements, the number of read steps equal to the number of bit registers in the bit column, and the bit values from the at least two read steps are stored in the at least two bit registers respectively, followed by a sequence of consecutive refresh steps equal to the number of read steps.

In alternative preferred embodiments individual capacitance elements in the memory structure in a single column are assigned to individual registers. For example, in one such scheme, having two registers connected per column, one half of capacitance elements in the column are assigned to one register connected in the column, and the other half of the capacitance elements in the column are assigned to, and stored in the other register in the column during read and refresh cycles. In this case two read steps are followed by two refresh steps, one for each of the cells read.

The number of registers connected in each column may theoretically be unlimited, but size, volume, and connectivity demands ensure a limitation. For reasons of system architecture based on powers of two, interleaving of DRAM memory provided by the unique architecture described herein as an invention follows preferably powers of 2 (2:4:8:16:32 . . . ). In this manner register arrays may be connected to DRAM columns such that one portion of such an array may be used to support a CPU and another portion may support video circuitry.

The apparatus of the present invention provides a method of interleaving refresh cycles in a DRAM such that different associated register arrays may support entirely different functions. The payback is significantly reduced DRAM access time. For example, as stated above, one array may support a CPU and another, video, in the manner of shared-frame buffer memory. In other aspects, different register arrays can support different memory pages.

DESCRIPTION OF THE PREFERRED EMBODIMENTS

Introduction

It is well known to those with skill in the art, as described above, that an electric charge stored in a capacitor unit of a memory cell of a dynamic random-access memory (DRAM) must be refreshed periodically, otherwise, the stored data is lost. Such charge refreshment takes place every time a memory cell is accessed during a read cycle, during which bit values are accessed and replenished, and data is provided at output lines to a data bus. Read cycles do not, however, occur often enough to avoid charge decay resulting in data loss in memory. To be sure no data is lost, it is necessary to enforce refresh cycles in addition to read cycles.

A refresh cycle starts with a read sequence, which involves sensing, amplifying and refreshing the charge of each memory cell of an addressed row. This read sequence is followed immediately by a precharge sequence during which all capacitors of this row are disconnected from their bit lines, and the electric potential of these bit lines is precharged to half the memory supply voltage.

The present invention in various embodiments involves grouping two or more consecutive refresh or read cycles effectively reducing precharge time.

For example, if refresh cycles involving any two rows of a memory array are executed consecutively, the charges of the memory cells of both rows can be sensed, amplified and stored before they are refreshed. As a result of grouping read and charge-refresh sequences, the precharge time following the first read sequence can be significantly reduced.

As is described in more detail below, altered refresh cycles according to embodiments of the present invention may be executed more quickly than is possible with conventional refresh cycles. However, to accomplish this improvement of DRAM speed, conventional DRAM architecture has to altered.

General Description

It is well known to those with skill in the art that a DRAM refresh cycle is typically and generally a read cycle without access to a DRAM I/O port. Therefore, only a refresh cycle need be considered to explain the minimizing-precharge feature according the present invention. The example provided herein explains how during two consecutive refresh cycles the precharge time may be minimized by implementing four particular operational sequences, which hereafter are referred to as a first read sequence, a second read sequence, a first refresh sequence, and a second refresh sequence according an embodiment of the present invention. It will be apparent to those with skill in the art that precharge time also can be minimized for more than two consecutive refresh cycles, or a combination of two or more consecutive refresh and read cycles.

Figure 1:
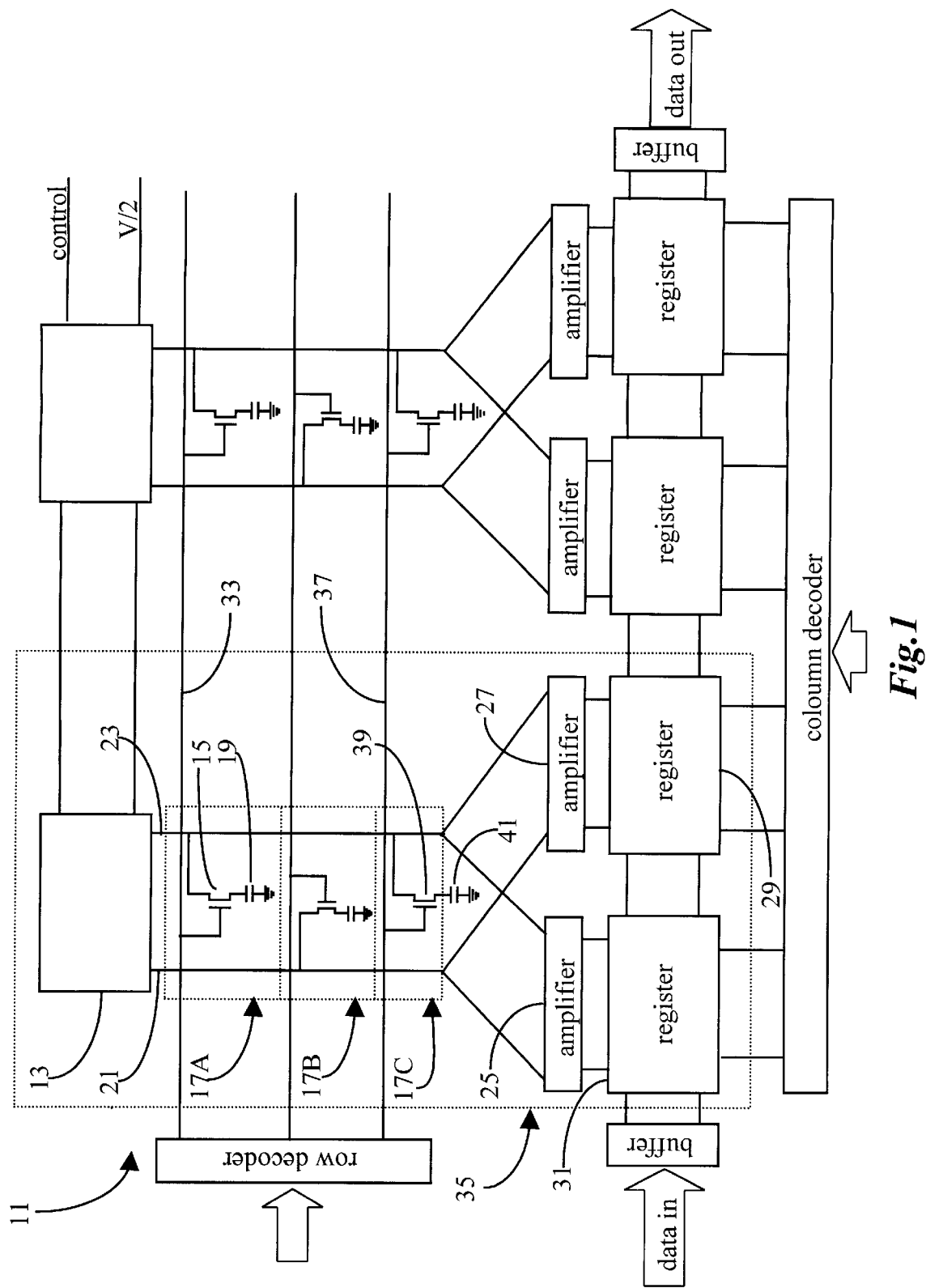
FIG. 1 is a block diagram of a DRAM architecture according to an embodiment of the present invention.

FIG. 1 is a block diagram of a DRAM architecture featuring dual amplifiers and dual registers for each column of a DRAM array according a preferred embodiment of the present invention. An exemplary column 35 comprises a precharge circuit 13, an array of memory cells of which only memory cells 17a, 17b, and 17c are shown, a first amplifier 25, a second amplifier 27, a first register 31, a second register 29, a first bit line 21, and a second bit line 23.

Figure 2:
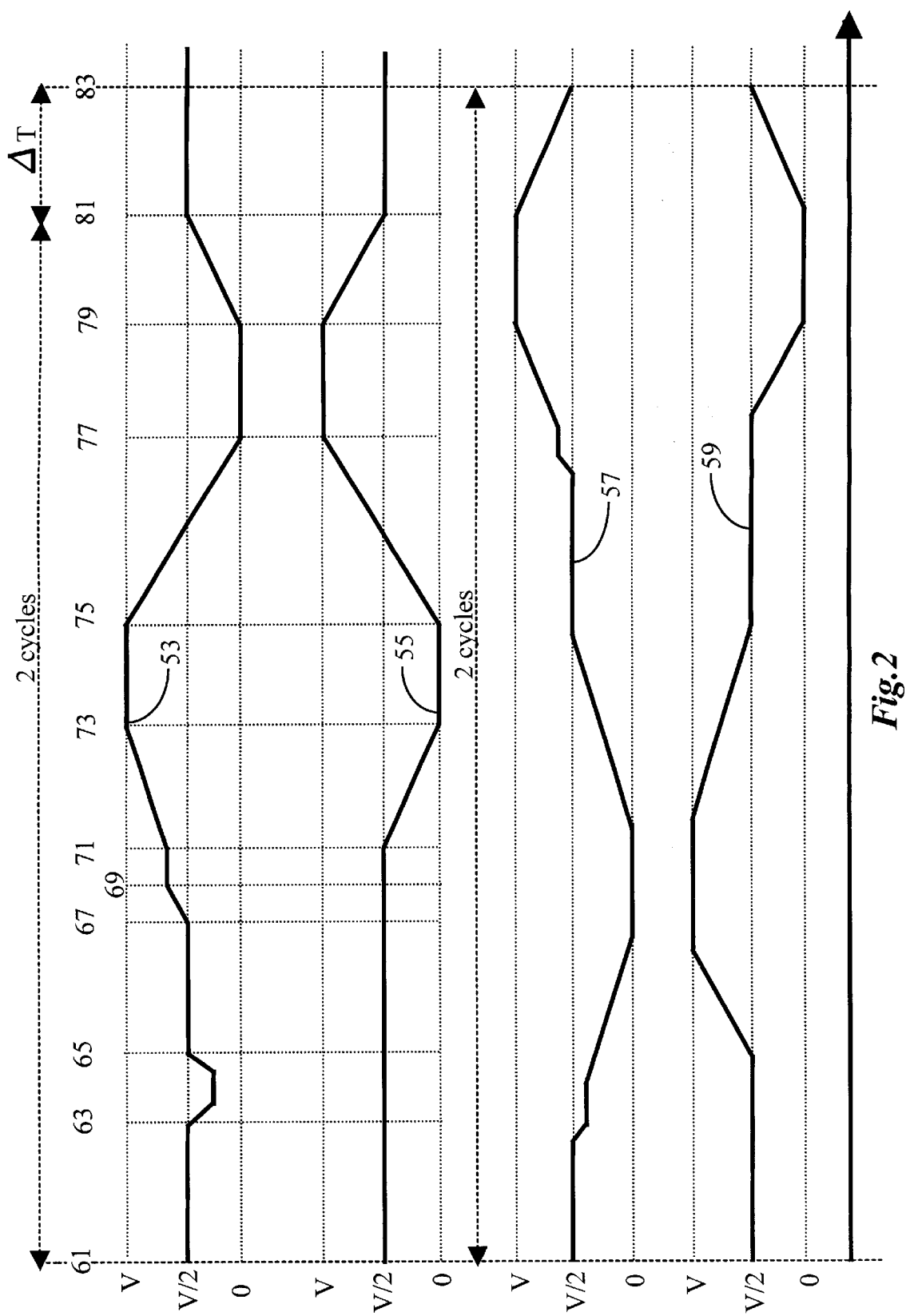
FIG. 2 is an approximate timing diagram for the embodiment shown in FIG. 1.

FIG. 2 is an approximate timing diagram showing time-dependent voltages 53 and 56 on bit lines 23 and 21 that exist during a dual refresh cycle in elements of the DRAM architecture of FIG. 1 according an embodiment of the present invention. Signals 57 and 59 are time-dependent voltages for bit-line signals in a conventional DRAM.

To avoid confusion in terms, some explanation of terms used thus far in the specification and terms used in the following discussion is necessary. Read and refresh cycles were discussed above from a viewpoint external to a memory. In this context, a read cycle means accessing bit values (voltage levels) from capacitance units in the memory, and providing those bit values to registers where they may be retrieved by a bus external to the memory. In this read cycle, after the bit values are accessed, the capacitance units are recharged to the voltage level sensed (refreshed). The steps of sensing (reading) bit values and refreshing the capacitors are followed also in a hidden refresh cycle, except the bit values are not made available to a data port. So every such cycle, either a read cycle or a refresh cycle involves (conventionally) a read step followed by a refresh step.

In the discussion below, the viewpoint is from within the memory structure, so a read step will mean sensing the voltage in a capacitance unit, and a refresh step will mean replacing the voltage level in the capacitance unit.

At an event marker 61, a first read step commences while the amplitude of bit-line signals 53, 56, 57 and 59 is equal to half the memory supply potential, which is V/2. At event marker 63, a memory controller addresses a row line 33 (FIG. 1), which causes all access transistors connected to this row to switch on. Referring to FIG. 1 and observing memory cell 17a, access transistor 15 switches on due to activated row line 33 and connects capacitor 19 to bit line 23. Assuming capacitor 19 is not charged, a portion of an electric charge (V/2) on bit line 23 flows into capacitor 19 at event marker 63 (FIG. 2). Hence, the voltage amplitude of bit-line signal 53 (FIG. 2) decreases. First amplifier 25 senses and amplifies the amplitude change and stores the result as a digital bit in first register 31 from where it may be retrieved by a user. At an event marker 65 (FIG. 2), a memory controller releases row line 33 which causes capacitor 19 to be disconnected from bit line 23 and causes precharge circuit 13 to restore bit-line signal 53 (FIG. 2) on bit line 23 to half the supply potential.

A second read sequence that may, for example, involve memory cells 20 connected to a row line 37, commences at an event marker 67 (FIG. 2).

Referring to memory cell 17c, a memory controller activates row line 37 causing a transistor 39 to switch on and connect capacitor 41 to bit line 23. Assuming capacitors 41 is charged to the memory supply potential, a portion of electric charge in capacitor 41 flows into bit line 23. Hence, the amplitude of bit-line signal 53 (FIG. 2) increases. During the time lapse between event marker 69 (FIG. 2)and 71 (FIG. 2), second amplifier 27 senses and amplifies the amplitude change and stores the result as a digital bit in second register 29 from where it may be retrieved by a user.

At an event marker 73 (FIG. 2), the amplified signal generated during the second read sequence is applied to bit lines 23 and 21 and restores the charge of capacitor 41. The refresh cycle for memory cells of row line 37 is thereby completed. At an event marker 75 (FIG. 2), the amplified signal generated during the first read sequence and stored in register 31 is applied to bit-lines 23 and 21 and at event marker 77 (FIG. 2) restores the charge of capacitor 19 to its initial level. The refresh cycle for memory cells of row line 33 is thereby completed.

At event marker 79 (FIG. 2), precharge circuit 13 restores the potential on bit line 23 and bit line 21 to half the supply potential. A precharge sequence for the first read cycle took place just before event marker 65 (FIG. 2). But, because of the small change of bit-line signal 53 (FIG. 2), this precharge requires much less time than if the change had been equal to half the memory supply voltage as is the case in a conventional refresh cycle. As a result, using two consecutive read steps as described above drastically reduces the precharge time of the first precharge sequence, and therefore, reduces refresh cycle time.

Referring to FIG. 2, the approximate refresh cycle time saved is clearly illustrated by event markers 81 and 83, which show the time difference between two refresh cycles executed by a DRAM according to an embodiment of the present invention and two refresh cycles concurrently executed by a conventional DRAM.

It will be apparent to those with skill in the art that there are many possible variations in the application of minimized precharge time. For example, it is not strictly necessary that there be two amplifiers and two separate bit lines per column in the DRAM. It is necessary, however, to have two registers. By having more than one register array and interleaving read and refresh steps in DRAM, multiple pages can be open concurrently, and a DRAM memory may operate like a cache memory. This architecture also may be applied to shared frame-buffer memory, where one set of registers may support video while another set of registers supports a CPU. Furthermore, multiple register arrays permits various caching and paging schemes such as cache lock-down by utilizing unused control signals to store the address of a preference page in a register decoder.

It will be apparent to those with skill in the art that there will be many alterations that might be made in the embodiments of the invention described herein without departing from the spirit and scope of the invention. For example, interleaving may be done in a broad variety of ways other than dual register arrays. The interleave ratio may theoretically be any multiple, such a 1:3, 1:6, 1:8, and so forth. For reasons of binary arithmetic and addressing conventions, it is preferable, however, to interleave in ratios that are powers of two, such as 1:2, 1:4, 1:8, 1:16, and so forth. By increasing the interleave ratio significant time savings in DRAM access may be attained.

What is claimed is:

1. A dynamic random access memory (DRAM) array comprising plural bit columns, wherein each bit column comprises:

a precharge circuit:

a bit line connected to the precharge circuit;

a plurality of capacitance elements for storing charges representing bits, each capacitance element separately connected through a single access transistor to the bit line;

an amplifier connected to the bit line; and at least two bit registers connected to the amplifier;

wherein at least two read steps are performed consecutively in refresh cycles, reading the bit value in separate capacitance elements, the number of read steps equal to the number of bit registers in the bit column, and wherein the bit values from the at least two read steps are stored in at least two bit registers respectively, followed by a sequence of consecutive refresh steps equal to the number of read steps.

2. A DRAM array as in claim 1 wherein a first set of bit registers, one per memory column, form a first register array, a second set of bit registers, one per memory column, form a second register array, and an n-th set of bit registers, one per memory column, form an n-th register array, and wherein, in refresh cycles, n read steps are performed consecutively followed by n refresh steps.

3. A DRAM array as in claim 2 wherein one register array supports a CPU and another register array in the same DRAM supports a video function.

4. A DRAM array as in claim 2 wherein separate register arrays are organized as separate memory pages.

\* \* \* \* \*